United States Patent
Chen et al.

(10) Patent No.: US 7,744,720 B2
(45) Date of Patent: *Jun. 29, 2010

(54) SUPPRESSOR OF HOLLOW CATHODE DISCHARGE IN A SHOWER HEAD FLUID DISTRIBUTION SYSTEM

(75) Inventors: Lee Chen, Cedar Creek, TX (US); Lin Xu, Houston, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/951,861

(22) Filed: Dec. 6, 2007

(65) Prior Publication Data
US 2009/0145553 A1 Jun. 11, 2009

(51) Int. Cl.
*H01L 21/3065* (2006.01)
*C23C 16/455* (2006.01)
*C23C 16/505* (2006.01)
*B21K 21/08* (2006.01)

(52) U.S. Cl. .............. 156/345.34; 156/345.33; 118/715; 118/723; 29/890.142

(58) Field of Classification Search .............. 118/715, 118/723; 156/345.33, 345.34; 422/186.29; 29/25.01
See application file for complete search history.

(56) References Cited

U.S. PATENT DOCUMENTS

| 5,728,223 | A  | * | 3/1998  | Murakami et al. | 118/715    |
| 5,885,358 | A  | * | 3/1999  | Maydan et al.   | 118/723 R  |
| 2002/0088545 | A1 | * | 7/2002  | Lee et al.      | 156/345.33 |
| 2004/0168769 | A1 | * | 9/2004  | Matsuoka et al. | 156/345.33 |
| 2005/0109460 | A1 | * | 5/2005  | DeDontney et al.| 156/345.33 |
| 2006/0219362 | A1 | * | 10/2006 | Han et al.      | 156/345.33 |

* cited by examiner

*Primary Examiner*—Parviz Hassanzadeh
*Assistant Examiner*—Satish Chandra

(57) ABSTRACT

A chamber component configured to be coupled to a process chamber and a method of fabricating the chamber component is described. The chamber component comprises a chamber element comprising a first surface on a supply side of the chamber element and a second surface on a process side of the chamber element, wherein the chamber element comprises a reentrant cavity formed in the first surface and a conduit having an inlet coupled to the reentrant cavity and an outlet coupled to the second surface. Furthermore, the chamber component comprises an insertable member configured to couple with the reentrant cavity, the insertable member having one or more passages formed there through and each of the one or more passages are aligned off-axis from the conduit, wherein the one or more passages are configured to receive a process fluid on the supply side and the conduit is configured to distribute the process fluid from the one or more passages on the process side.

6 Claims, 6 Drawing Sheets

SUPPRESSOR OF HOLLOW CATHODE DISCHARGE IN A SHOWER HEAD FLUID DISTRIBUTION SYSTEM

BACKGROUND OF THE INVENTION

1. Field of the Invention

The invention relates to a chamber component configured to be coupled to a process chamber and a method of fabricating the chamber component.

2. Description of Related Art

The fabrication of integrated circuits (IC) in the semiconductor industry typically employs plasma to create and assist surface chemistry within a process chamber necessary to remove material from and deposit material on a substrate. In general, plasma is formed within the process chamber under vacuum conditions by heating electrons in the presence of an electric field to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

In semiconductor manufacturing, numerous techniques exist for creating plasma including, but not limited to, capacitively coupled plasma (CCP) systems, inductively coupled plasma (ICP) systems, electron cyclotron resonance (ECR) plasma systems, helicon wave plasma systems, surface wave plasma systems, slotted plane antenna (SPA) plasma systems, etc. Plasma is formed from the interaction of the supplied process gas with electromagnetic (EM) field propagation at frequencies in the radio frequency (RF) or microwave spectrum.

Common to many of these systems, the process gas is introduced to the process chamber through a shower head gas distribution system having a plurality of gas passages formed there through. However, in the presence of electric fields, utilized for example during plasma formation, hollow cathode discharges may be triggered within these gas passages. In plasma processing, such hollow cathode discharges may lead to plasma power loss and particle generation.

SUMMARY OF THE INVENTION

The invention relates to a chamber component configured to be coupled to a process chamber and a method of fabricating the chamber component.

According to one embodiment, a chamber component configured to be coupled to a process chamber and a method of fabricating the chamber component is described. The chamber component comprises a chamber element comprising a first surface on a supply side of the chamber element and a second surface on a process side of the chamber element, wherein the chamber element comprises a reentrant cavity formed in the first surface and a conduit having an inlet coupled to the reentrant cavity and an outlet coupled to the second surface. Furthermore, the chamber component comprises an insertable member configured to couple with the reentrant cavity, the insertable member having one or more passages formed there through and each of the one or more passages are aligned off-axis from the conduit, wherein the one or more passages are configured to receive a process fluid on the supply side and the conduit is configured to distribute the process fluid from the one or more passages on the process side.

According to another embodiment, a method of fabricating a conduit through a chamber element is described, comprising: forming a cylindrical counter-bore on a supply side of the chamber element, the cylindrical counter-bore having an inner sidewall surface; forming a cylindrical conduit through the chamber element extending from the bottom of the cylindrical counter-bore to a process side on the chamber element, the conduit having a diameter less than the diameter of the cylindrical counter-bore; forming a cylindrical, insertable member having a top surface, a bottom surface, and an outer surface configured to mate with the inner sidewall surface of the cylindrical counter-bore; forming one or more passages through the cylindrical, insertable member from the top surface to the bottom surface, wherein the outlet at the bottom surface for each of the one or more passages is not aligned with the cylindrical conduit; and inserting the cylindrical, insertable member into the cylindrical counter-bore of the chamber element.

According to another embodiment, a treatment system is described, comprising: a process chamber, including a process space; a process gas supply system in fluid communication with the process chamber and configured to introduce a flow of a process gas to the process chamber; a gas distribution system coupled to the process chamber and configured to receive the flow of the process gas through an inlet and distribute the flow of the process gas in the process space, wherein the gas distribution system comprises: a shower head gas distribution plate having a supply side that interfaces with a gas supply plenum, a process side that interfaces with the process space, and a plurality of gas passages formed from the supply side to the process side, wherein each of the plurality of gas passages comprise a counter-bore formed in the supply side and a conduit having an inlet coupled to the counter-bore and an outlet coupled to the process side, and wherein each of the plurality of gas passages comprise an insertable member configured to slidably insert within the counter-bore and configured with one or more passages formed there through, each of the one or more passages are aligned off-axis from the conduit; a substrate holder coupled to the process chamber and configured to support a substrate in the process chamber for exposure to the process gas; and a vacuum pumping system coupled to the process chamber and configured to evacuate the process chamber.

According to yet another embodiment, a gas distribution system is described, comprising: a shower head gas distribution plate having a supply side that interfaces with a gas supply plenum, a process side that interfaces with a process space in a process chamber, and a plurality of gas passages formed from the supply side to the process side, wherein each of the plurality of gas passages comprise a counter-bore formed in the supply side and a conduit having an inlet coupled to the counter-bore and an outlet coupled to the process side, and wherein each of the plurality of gas passages comprise an insertable member configured to slidably insert within the counter-bore and configured with one or more passages formed there through, each of the one or more passages are aligned off-axis from the conduit.

DETAILED DESCRIPTION OF EXEMPLARY EMBODIMENTS

In the following description, purposes of explanation and not limitation, specific details are set forth, such as a particular geometry of the plasma processing system and descriptions of various components. However, it should be understood that the invention may be practiced in other embodiments that depart from these specific details.

Nonetheless, it should be appreciated that, contained within the description are features which, notwithstanding the inventive nature of the general concepts being explained, are also of an inventive nature.

In material processing methodologies, plasma is often utilized to create and assist surface chemistry on a substrate to facilitate the removal of material from the substrate or to facilitate film forming reactions for depositing material on the substrate. During the etching of a substrate, plasma may be utilized to create reactive chemical species that are suitable for reacting with the certain materials on the surface of a substrate. Furthermore, during the etching of a substrate, plasma may be utilized to create charged species that are useful for delivering energy to surface reactions on the substrate.

Figure 2A:
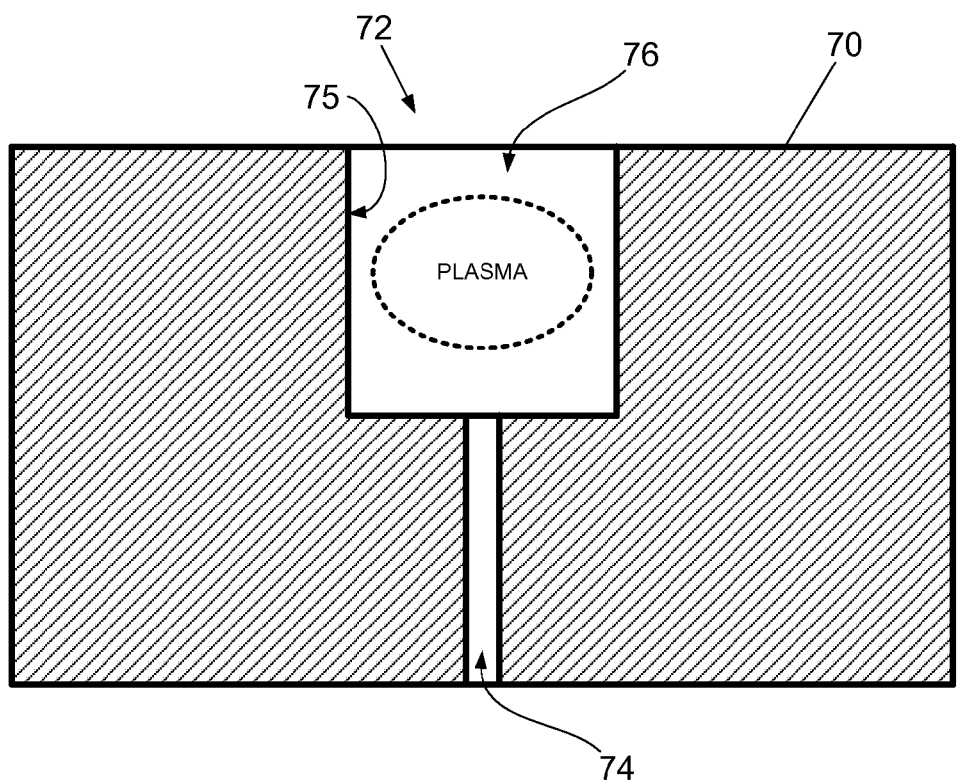
FIG. 2A shows an exploded view of a fluid passage.

As described above, in plasma processing systems, the process gas is introduced to the process chamber through a shower head gas distribution system having a plurality of gas passages formed there through. For example, FIG. 2A illustrates an exploded cross-sectional view of a gas passage 72 formed through a shower head gas distribution plate 70. Due to the difficulty in milling a high aspect ratio orifice through a (relatively) thick piece of material, the gas passage 72 is formed by creating a counter-bore 76 having a sidewall 75 on a supply side of the shower head gas distribution plate 70, and then milling a (relatively) narrow diameter gas conduit 74 through the remaining portion of the shower head gas distribution plate 70 to a process side.

Figure 2B:
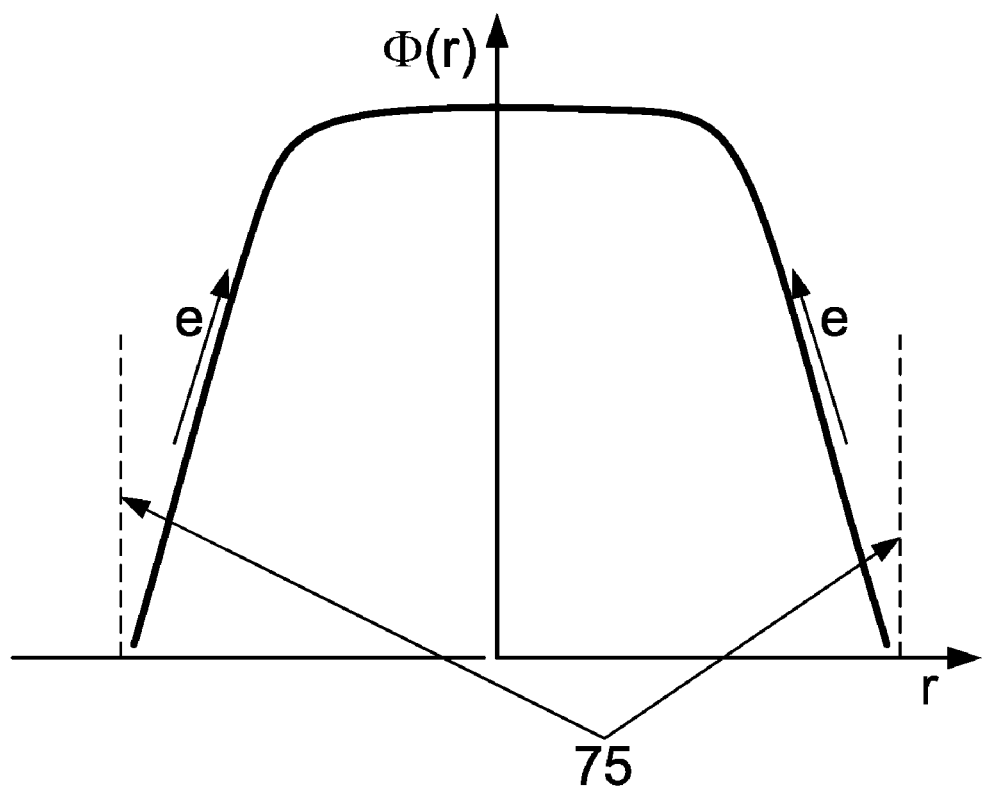
FIG. 2B illustrates a mechanism for creating a hollow cathode discharge in a fluid passage.

However, in the presence of electric fields, utilized for example during plasma formation, hollow cathode discharges may be triggered within these gas passages. In particular, the hollow cathode discharge occurs in the counter-bore 76. In plasma processing, such hollow cathode discharges may lead to plasma power loss and particle generation due to erosion of the shower head gas distribution plate 70. As illustrated in FIG. 2B, a plasma discharge can occur in counter-bore 76 between side-walls 75. Therein, a symmetrical field potential Φ(r) is established and electrons (e) are trapped, hence, creating the possibility of a hollow cathode discharge. In a balanced field, a surface emitted electron (e) may be accelerated through the adjacent sheath (proximate the counter-bore side wall where the electron is emitted) under a first field strength, and then decelerated through the opposing sheath (at the opposing wall of the counter-bore) at a second field strength that is substantially the same as the first field strength. As a result, the possibility for the electron to become trapped between the opposing sheaths and not strike an opposing wall is increased.

Therefore, according to one embodiment, a chamber component configured to be coupled to a process chamber and a method of fabricating the chamber component is described. The chamber component comprises a chamber element comprising a first surface on a supply side of the chamber element and a second surface on a process side of the chamber element, wherein the chamber element comprises a reentrant cavity formed in the first surface and a conduit having an inlet coupled to the reentrant cavity and an outlet coupled to the second surface. Furthermore, the chamber component comprises an insertable member configured to couple with the reentrant cavity, the insertable member having one or more passages formed there through and each of the one or more passages are aligned off-axis from the conduit, wherein the one or more passages are configured to receive a process fluid on the supply side and the conduit is configured to distribute the process fluid from the one or more passages on the process side.

Herein, the term fluid is used to generally refer to a material in a gaseous or liquid state. A fluid may include any one of the following: a gas, a liquid, a solid suspended in a gas, a solid suspended in a liquid, or a gas suspended in a liquid, or a combination of two or more thereof. However, in a plasma processing system, the fluid is typically in a gaseous state when processing a substrate.

According to another embodiment, a gas distribution system is described. The gas distribution system comprises a shower head gas distribution plate having a supply side that interfaces with a gas supply plenum, a process side that interfaces with a process space in a process chamber, and a plurality of gas passages formed from the supply side to the process side. Each of the plurality of gas passages comprises a counter-bore formed in the supply side and a conduit having an inlet coupled to the counter-bore and an outlet coupled to the process side. Furthermore, each of the plurality of gas passages comprises an insertable member configured to slidably insert within the counter-bore and configured with one or more passages formed there through, each of the one or more passages are aligned off-axis from the conduit. Due to the mis-alignment of the one or more passages with the conduit, the symmetry of the field potential in the counter-bore is destroyed, and the possibility for a hollow cathode discharge diminishes.

Although the gas distribution system is described for use in a plasma processing system, it may be used in a treatment system that does not utilize plasma.

Figure 1:
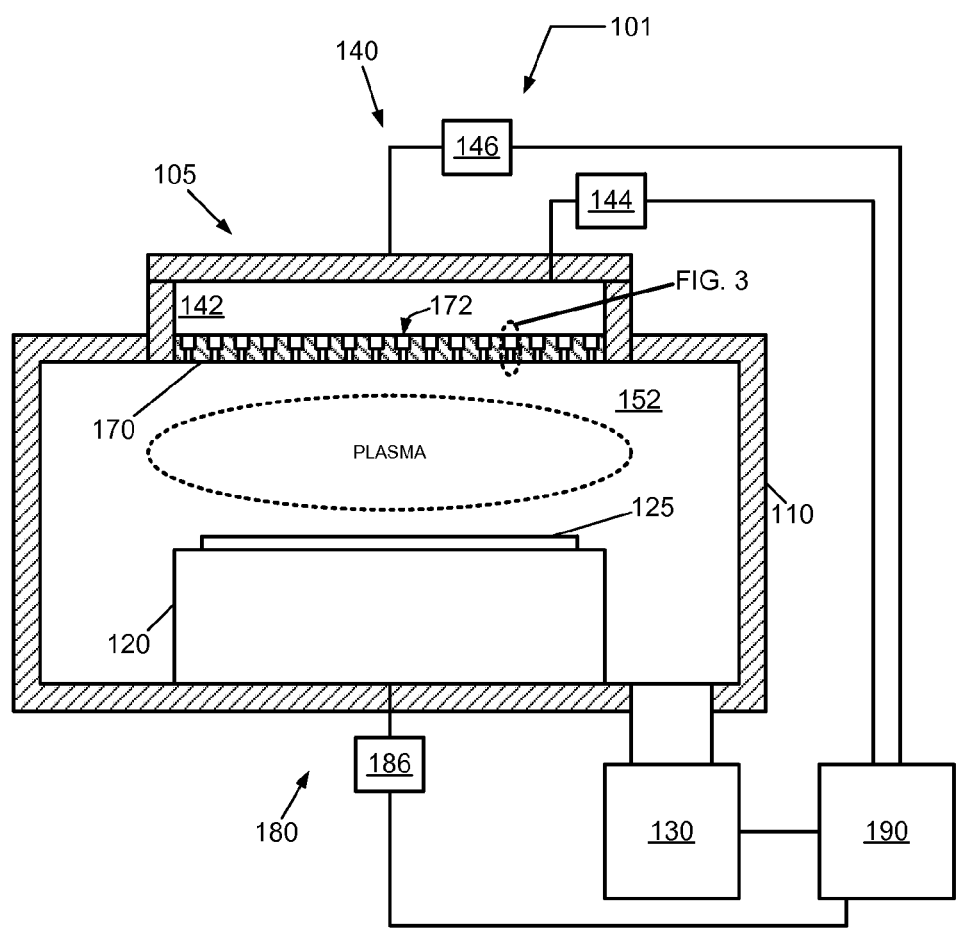
FIG. 1 shows a treatment system according to an embodiment.

According to another embodiment, a plasma processing system 101 is depicted in FIG. 1 comprising a plasma process chamber 110, a substrate holder 120, upon which a substrate 125 to be processed is affixed, and a vacuum pumping system 130. Substrate 125 can, for example, be a semiconductor substrate, a wafer, a flat panel display, or a liquid crystal display.

A gas distribution system 105 is coupled to the plasma process chamber 110 and is configured to introduce an ionizable gas or mixture of process gases. For a given flow of process gas, the chamber pressure in the plasma process chamber 110 is adjusted using the vacuum pumping system 130.

A plasma generation system 140 is coupled to the plasma process chamber 110 and is configured to facilitate the generation of plasma in process space 152 in the vicinity of a surface of substrate 125. Plasma can be utilized to create materials specific to a pre-determined materials process, and/or to aid the removal of material from the exposed surfaces of substrate 125. The plasma processing system 101 can be configured to process substrates of any desired size, such as 200 mm substrates, 300 mm substrates, or larger. The plasma generation system 140 comprises at least one of a capacitively coupled plasma source, an inductively coupled plasma source, a transformer coupled plasma source, a microwave plasma source, a surface wave plasma source, or a helicon wave plasma source.

For example, the plasma generation system 140 may comprise an upper electrode to which radio frequency (RF) power is coupled via a RF generator 146 through an optional impedance match network. EM energy at an RF frequency is capacitively coupled from the upper electrode to plasma in process space 152. A typical frequency for the application of RF power to the upper electrode can range from about 10 MHz to about 100 MHz. Further, for example, the upper electrode may be integrated with the gas distribution system 105.

An impedance match network may serve to improve the transfer of RF power to plasma by reducing the reflected power. Match network topologies (e.g. L-type, π-type, T-type, etc.) and automatic control methods are well known to those skilled in the art.

A substrate bias system 180 may be coupled to the plasma process chamber 110 and may be configured to electrically bias substrate 125. For example, substrate holder 120 can comprise an electrode through which RF power is coupled to substrate 125 in order to adjust and/or control the level of energy for ions incident upon the upper surface of substrate 125. For example, substrate holder 120 can be electrically biased at a RF voltage via the transmission of RF power from a RF generator 186 through an optional impedance match network to substrate holder 120. The substrate bias system 180 may serve to heat electrons to form and maintain plasma. Additionally, the substrate bias system 180 may serve to adjust and/or control the ion energy at the substrate. A typical frequency for the RF bias can range from about 0.1 MHz to about 100 MHz. RF systems for plasma processing are well known to those skilled in the art.

Vacuum pumping system 130 may include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma process chamber 110. The pressure measuring device can be, for example, a Type 628B Baratron absolute capacitance manometer commercially available from MKS Instruments, Inc. (Andover, Mass.).

Controller 190 may comprise a microprocessor, memory, and a digital I/O port capable of generating control voltages sufficient to communicate and activate inputs to plasma processing system 101 as well as monitor outputs from plasma processing system 101. Moreover, controller 190 can be coupled to and can exchange information with gas distribution system 105, plasma generation system 140, substrate holder 120, substrate bias system 180, and vacuum pumping system 130. For example, a program stored in the memory can be utilized to activate the inputs to the aforementioned components of plasma processing system 101 according to a process recipe in order to perform a plasma assisted process on substrate 125.

Controller 190 may be locally located relative to the plasma processing system 101, or it may be remotely located relative to the plasma processing system 101. For example, controller 190 can exchange data with plasma processing system 101 using a direct connection, an intranet, and/or the internet. Controller 190 can be coupled to an intranet at, for example, a customer site (i.e., a device maker, etc.), or it can be coupled to an intranet at, for example, a vendor site (i.e., an equipment manufacturer). Alternatively or additionally, controller 190 can be coupled to the internet. Furthermore, another computer (i.e., controller, server, etc.) can access controller 190 to exchange data via a direct connection, an intranet, and/or the internet.

Furthermore, embodiments of this invention may be used as or to support a software program executed upon some form of processing core (such as a processor of a computer, e.g., controller 190) or otherwise implemented or realized upon or within a machine-readable medium. A machine-readable medium includes any mechanism for storing information in a form readable by a machine (e.g., a computer). For example, a machine-readable medium can include such as a read only memory (ROM); a random access memory (RAM); a magnetic disk storage media; an optical storage media; and a flash memory device, etc.

The gas distribution system 105 is configured to receive a flow of process gas from a gas supply system 144 through an inlet to a gas supply plenum 142 and distribute the flow of process gas in a process space 152. The gas distribution system 105 may comprise a shower head gas distribution plate 170 having a supply side that interfaces with the gas supply plenum 142, a process side that interfaces with the process space 152, and a plurality of gas passages 172 formed from the supply side to the process side.

Figure 3:
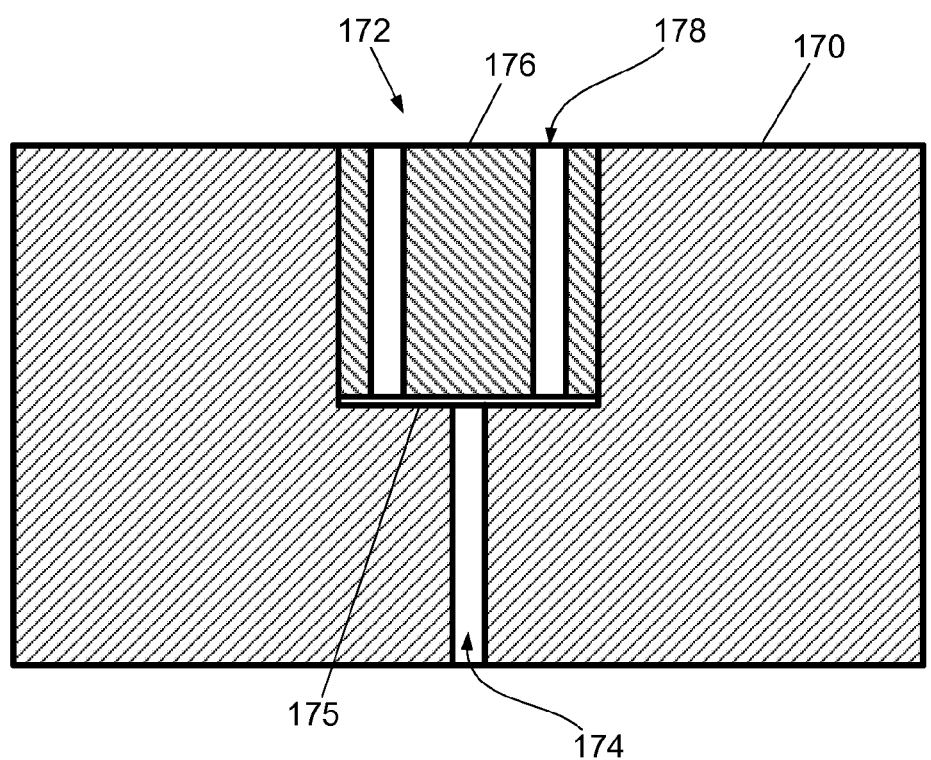
FIG. 3 shows an exploded, cross-sectional view of a fluid passage according to an embodiment.

Referring now to FIG. 3, an exploded cross-sectional view of a portion of shower head gas distribution plate 170 is provided. Each of the plurality of gas passages 172 comprise a reentrant cavity 175 formed in the supply side and a conduit 174 having an inlet coupled to the reentrant cavity 175 and an outlet coupled to the process side. Each of the plurality of gas passages 172 comprise an insertable member 176 configured to slidably insert within the reentrant cavity 175 and configured with one or more passages 178 formed there through. Each of the one or more passages is aligned off-axis from the conduit 174, i.e., as shown in FIG. 3, each of the one or more passages 178 is mis-aligned with conduit 174.

Figure 4:
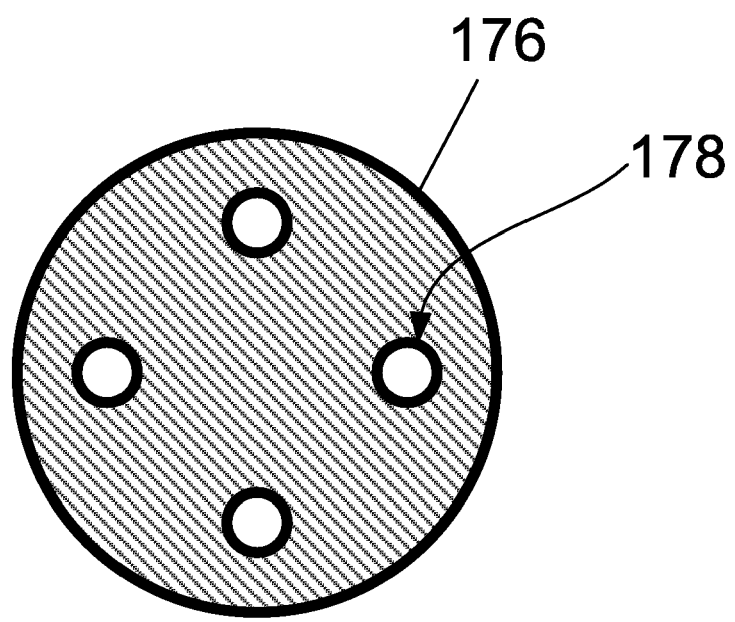
FIG. 4 shows an exploded, top view of a fluid passage according to an embodiment.
Figure 5:
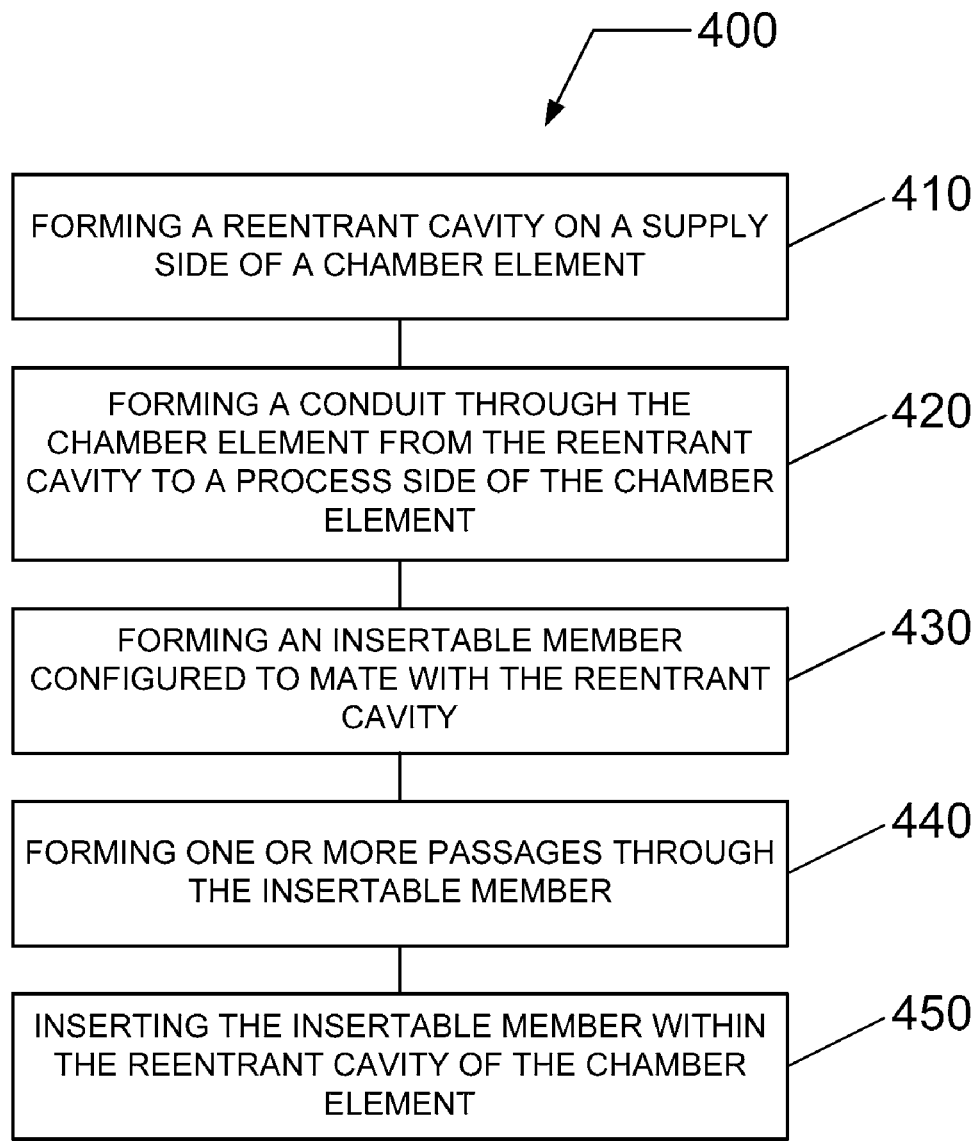
FIG. 5 illustrates a method of fabricating a fluid passage according to an embodiment.

Referring now to FIG. 4, a top view of insertable member 176 is illustrated. Insertable member 176 comprises four passages 178 positioned every 90 degrees. Although only four passages 178 are shown, other arrangements are possible. The one or more passages 178 may include 1, 2, 3, 5, or more, and the distribution of the one or more passages 178 may be arbitrary as long as each of the one or more passages 178 are mis-aligned with conduit 174. Therefore, process fluid flows from the supply side through the one or more passages 178, through the micro-space between the bottom of the insertable member 176 and the base of the reentrant cavity, and through the conduit 174 to the process side. The micro-space at the bottom of the reentrant cavity 175 may be the space remaining once the insertable member 178 is introduced to its full extent into the reentrant cavity 175. Alternatively, the maximum width of the micro-space may selected to be less than a Debye length for a hollow cathode discharge formed in the reentrant cavity 175 when the insertable member 176 is not present. Alternatively, the bottom surface of the insertable member 176 or the bottom surface of the reentrant cavity 175 or both may be scored (i.e., formation of a groove) to allow a less-restricted flow of the process gas from the one or more passages 178 to the conduit 174.

The insertion of the insertable member 176 into the reentrant cavity 175 disturbs the symmetric field (illustrated in FIG. 2B). As a result, an unbalanced field pattern is formed across the one or more passages 178. In an unbalanced field, a surface emitted electron may be accelerated through the adjacent sheath at a first field strength, while the electron is decelerated through the opposing sheath at a second field strength that is different than the first field strength. Therefore, the possibility the electron strikes the opposing wall is increased (hence, the electron does not get trapped).

The insertable member 176 may be composed of a conductive, a non-conductive, or a semi-conductive material. The insertable member 176 may be composed of a dielectric material. For example, the insertable member 176 may be composed of a ceramic material. Additionally, for example, the insertable member 176 may be composed of silicon, silicon oxide, silicon nitride, silicon carbide, aluminum oxide, aluminum nitride, polytetrafluoroethylene (PTFE), or polyimide, or a combination of two or more thereof.

The reentrant cavity 175 may comprise a counter-bore, such as a cylindrical counter-bore. For example, the diameter of the cylindrical counter-bore may range from about 1 mm (millimeter) to about 20 mm or, desirably, the diameter of the cylindrical counter-bore may range from about 2 mm to 10 mm (e.g., about 4-5 mm). The conduit 174 may comprise a cylindrical passage having a diameter less than the diameter of the cylindrical counter-bore. The conduit 174 may be centered on the reentrant cavity 175 (e.g., same centerline axis). For example, the diameter of the conduit may range from 10 microns (1 micron=$10^{-6}$ m) to about 1 mm or, desirably, the diameter of the conduit may range from about 50 microns to about 500 microns (e.g., about 100 microns). Furthermore, each of the one or more passages 178 may comprise a cylindrical passage. For example, the diameter of each of the one or more passages may range from 10 microns to about 1 mm or, desirably, the diameter of each of the one or more passages may range from about 50 microns to about 500 microns (e.g., about 100 microns).

The insertable member 176 may comprise a cylindrical member having an outer surface configured to mate with the inner surface of the cylindrical counter-bore, a top surface and a bottom surface. Additionally, the one or more passages 178 extend from the top surface to the bottom surface at the base of the counter-bore.

Referring now to FIG. 4, a flow chart 400 of a method for fabricating a conduit through a chamber element is described according to an embodiment of the invention. Flow chart 400 begins in 410 with forming a reentrant cavity on a supply side of a chamber element. For example, a cylindrical counter-bore may be formed on a supply side of the chamber element, wherein the cylindrical counter-bore has an inner sidewall surface.

In 420, a cylindrical conduit is formed through the chamber element from the reentrant cavity to a process side of the chamber element. For example, a cylindrical conduit may be formed through the chamber element extending from the bottom of the cylindrical counter-bore to a process side on the chamber element, wherein the conduit has a diameter less than the diameter of the cylindrical counter-bore.

In 430, an insertable member is formed that is configured to mate with the reentrant cavity. For example, a cylindrical, insertable member may be formed having a top surface, a bottom surface, and an outer surface configured to mate with the inner sidewall surface of the cylindrical counter-bore.

In 440, one or more passages are formed through the insertable member. For example, one or more passages may be formed through the cylindrical, insertable member from the top surface to the bottom surface, wherein the outlet at the bottom surface for each of the one or more passages is not aligned with the cylindrical conduit.

In 450, the insertable member is inserted within the reentrant cavity of the chamber element. For example, the cylindrical, insertable member may be inserted into the cylindrical counter-bore of the chamber element. The insertable member may be inserted within the reentrant cavity of the chamber element by press fitting the insertable member into the reentrant cavity of the chamber element, or thermally fitting the insertable member into the reentrant cavity of the chamber element, or fusing the insertable member into the reentrant cavity of the chamber element. Alternatively, the insertable member may be inserted within the reentrant cavity of the chamber element by welding or brazing the insertable member into the chamber element.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A chamber component configured to be coupled to a process chamber, comprising:

a chamber element comprising a first surface on a supply side of said chamber element and a second surface on a process side of said chamber element, said process side opposing said supply side, wherein said chamber element comprises a reentrant cavity formed in said first surface and a conduit having an inlet coupled to said reentrant cavity and an outlet coupled to said second surface; and an insertable member configured to slidably insert into said reentrant cavity and occupy said reentrant cavity, said insertable member having one or more passages formed there through and each of said one or more passages are aligned off-axis from said conduit;

wherein said one or more passages are configured to receive a process fluid on said supply side and said conduit is configured to distribute said process fluid from said one or more passages on said process side, wherein said chamber component comprises a shower head gas distribution plate configured to be coupled to a gas distribution system and distribute said process fluid in a plasma processing system, and wherein said shower head gas distribution plate comprises a plurality of said insertable members coupled to a plurality of said reentrant cavities formed on said supply side of said shower head gas distribution plate and configured to permit the passage of said process fluid through a plurality of said conduits to said process side, wherein said gas distribution system is integrated with a powered radio frequency (RF) electrode, wherein a bottom surface of said insertable member comprises a groove to allow a less-restricted flow of said process fluid from said one or more passages in said insertable member to said conduit, and wherein said bottom surface of said insertable member contacts an upper surface of said reentrant cavity such that a spacing between said bottom surface of said insertable member and said upper surface of said reentrant cavity is less than a debye length for plasma at said process side.

2. The chamber component of claim 1, wherein said insertable member is composed of a dielectric material.

3. The chamber component of claim 1, wherein said insertable member is composed of silicon, silicon oxide, silicon nitride, silicon carbide, aluminum oxide, aluminum nitride, polytetrafluoroethylene (PTFE), or polyimide, or a combination of two or more thereof 4. The chamber component of claim 1, wherein said reentrant cavity comprises a counter-bore formed in said first surface and said conduit comprises a cylindrical passage having a diameter less than the diameter of said counter-bore, and wherein said insertable member comprises a cylindrical member configured to slidably insert into said counter-bore.

5. The chamber component of claim 4, wherein said one or more passages in said insertable member comprise one or more cylindrical passages extending through said insertable member from a top surface of said insertable member to said bottom surface of said insertable member at the base of said counter-bore.

6. The chamber component of claim 1, wherein a diameter of said conduit ranges from about 10 microns to about 1 millimeter, and a diameter of each of said one or more passages ranges from about 10 microns to about 1 millimeter.

* * * * *